US012614705B2

(12) United States Patent
Jeong

(10) Patent No.: US 12,614,705 B2
(45) Date of Patent: Apr. 28, 2026

(54) PLASMA MONITORING SYSTEM

(71) Applicant: SAMSUNG ELECTRONICS CO., LTD., Suwon-si (KR)

(72) Inventor: Yunsong Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 235 days.

(21) Appl. No.: 18/224,664

(22) Filed: Jul. 21, 2023

(65) Prior Publication Data

US 2024/0203714 A1 Jun. 20, 2024

(30) Foreign Application Priority Data

Dec. 16, 2022 (KR) ........................ 10-2022-0176608

(51) Int. Cl.
*H01J 37/32* (2006.01)

(52) U.S. Cl.
CPC .................. *H01J 37/32972* (2013.01); *H01J 2237/24585* (2013.01); *H01J 2237/334* (2013.01)

(58) Field of Classification Search
None
See application file for complete search history.

(56) References Cited

U.S. PATENT DOCUMENTS 6,972,840 B1 12/2005 Gu et al.
8,085,390 B2 12/2011 Luoh et al.

| | | | |
|---|---|---|---|
| 10,473,525 B2 | 11/2019 | Meng et al. | |
| 10,541,184 B2 * | 1/2020 | Jung | H01L 21/3065 |
| 10,943,804 B2 | 3/2021 | Chen et al. | |
| 11,276,590 B2 | 3/2022 | Samir et al. | |
| 2008/0099450 A1 | 5/2008 | Lewington et al. | |
| 2017/0314991 A1 * | 11/2017 | Meng | G01N 21/68 |
| 2019/0019734 A1 * | 1/2019 | Jung | G01N 21/31 |
| 2020/0013596 A1 | 1/2020 | Yun | |
| 2024/0096608 A1 * | 3/2024 | Teruuchi | H01J 37/32935 |

FOREIGN PATENT DOCUMENTS

| | | |
|---|---|---|
| KR | 10-2082698 B1 | 1/2020 |
| KR | 10-2020-0071373 A | 6/2020 |

\* cited by examiner

*Primary Examiner* — Kara E. Geisel
*Assistant Examiner* — Chad Andrew Reverman
(74) *Attorney, Agent, or Firm* — Muir Patent Law, PLLC

(57) ABSTRACT

A plasma monitoring system includes a chamber with an interior space, the chamber being configured to perform a semiconductor process on a semiconductor substrate using plasma in the interior space, and the chamber including an optical window, a substrate stage within the chamber to support the semiconductor substrate, a light collecting device on the substrate stage, the light collecting device including a body and light collectors, the body having through holes therethrough, and the light collectors being configured to collect light respectively incident on the through holes from the plasma and to transfer the collected lights onto the optical window, and a light analyzer including a spectrometer that is configured to obtain an optical spectrum from each light irradiated onto the optical window, and to map a state of the plasma from the optical spectrum to correspond to positions of the through holes.

19 Claims, 6 Drawing Sheets

1

PLASMA MONITORING SYSTEM

CROSS-REFERENCE TO RELATED APPLICATION

This application claims priority under 35 U.S.C. § 119 to Korean Patent Application No. 10-2022-0176608, filed on Dec. 16, 2022, in the Korean Intellectual Property Office (KIPO), the contents of which are herein incorporated by reference in their entirety.

BACKGROUND

1. Field

Example embodiments relate to a plasma monitoring system. More particularly, example embodiments relate to a plasma monitoring system capable of monitoring a state of plasma in a chamber in which a plasma process is performed.

2. Description of the Related Art

In a plasma process for forming a pattern on a semiconductor substrate, a plasma state in a chamber may be monitored in real time to increase reliability of the plasma process. An energy state of plasma may be monitored by determining species of particles that are emitted from a wavelength of light through optical emission spectroscopy.

SUMMARY

According to example embodiments, a plasma monitoring system includes a chamber providing a plasma space configured to perform a semiconductor process on a semiconductor substrate using plasma, the chamber including a side wall that has an optical window therein, a substrate stage provided within the chamber, the substrate stage configured to support the semiconductor substrate, a light collecting device disposed on the substrate stage, the light collecting device including a body and a plurality of light collectors, the body having a plurality of through holes formed therethrough, the plurality of light collectors configured to collect lights respectively incident on the through holes from the plasma and transfer the collected lights onto the optical window, and a light analysis device including a spectrometer that is configured to obtain optical spectrum from each of the lights irradiated onto the optical window, the light analysis device configured to map a state of the plasma from the optical spectrum to correspond to positions of the through holes.

According to example embodiments, a plasma monitoring system includes a chamber providing a plasma space configured to perform a plasma process on a semiconductor substrate, the chamber including an optical window and a substrate stage that is configured to support the semiconductor substrate, a light collecting device disposed on the substrate stage, the light collecting device including a body and a plurality of light collectors, the body having a plurality of through holes formed to extend therethrough, the plurality of light collectors configured to collect lights respectively incident on the through holes from plasma and transfer the collected lights onto the optical window, and an light analysis device configured to obtain optical spectrum from each of the lights irradiated onto the optical window, the light analysis device configured to map a state of the plasma from the optical spectrum to correspond to positions of the through holes. Each of the light collector includes, a reflection mirror configured to reflect at least some of the lights incident through the through hole, an optical fiber configured to transmit the some of the lights reflected from the reflection mirror, and a collimator configured to illuminate the portions of the lights transmitted from the optical fiber toward the optical window.

According to example embodiments, a plasma monitoring system includes a chamber providing a plasma space configured to perform a plasma process on a semiconductor substrate, the chamber including an optical window and a substrate stage that is configured to support the semiconductor substrate, a light collecting device disposed on the substrate stage, the light collecting device including a body, a plurality of light collectors, and an alignment fixture, the body having a plurality of through holes, the plurality of light collectors configured to collect lights respectively incident on the through holes from plasma and transfer the collected lights onto the optical window, the alignment fixture provided on one side of the body and fixing a portion of the light collectors in a predetermined arrangement, and an light analysis device including an optical scanner and a spectrometer, the light analysis device configured to map a state of the plasma from an optical spectrum to correspond to positions of the through holes, the optical scanner configured to sequentially scan the lights reflected from the light collectors, the spectrometer configured to obtain the optical spectrum from the lights. Each of the light collectors includes, a reflection mirror configured to reflect at least portion of the lights incident through the through hole, an optical fiber configured to transmit the at least portion of the lights reflected from the reflection mirror, and a collimator configured to illuminate the at least portions of the lights transmitted from the optical fiber toward the optical window.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, example embodiments will be explained in detail with reference to the accompanying drawings.

Figure 1:
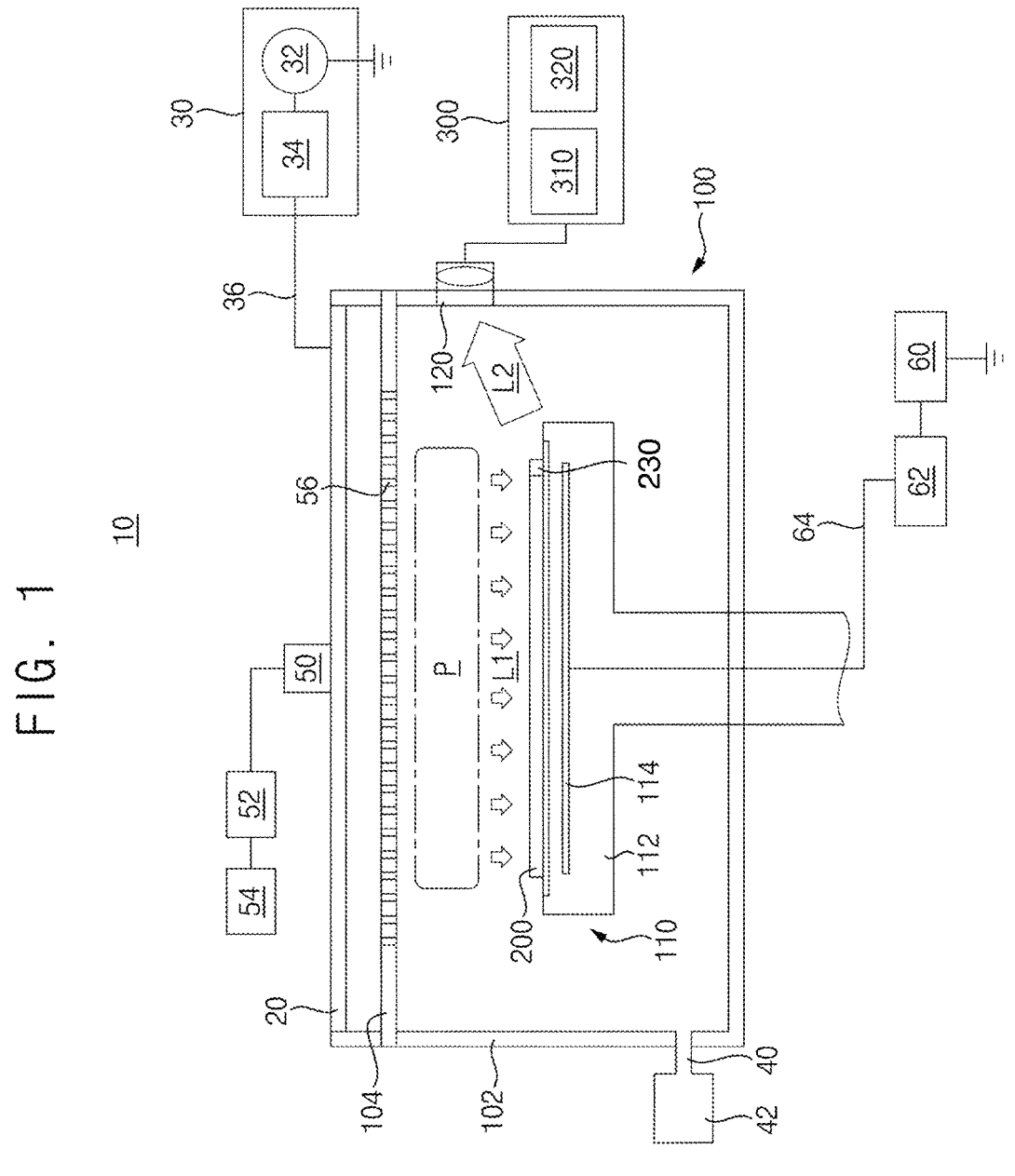
FIG. 1 is a cross-sectional view illustrating a plasma monitoring system in accordance with example embodiments.
Figure 2:
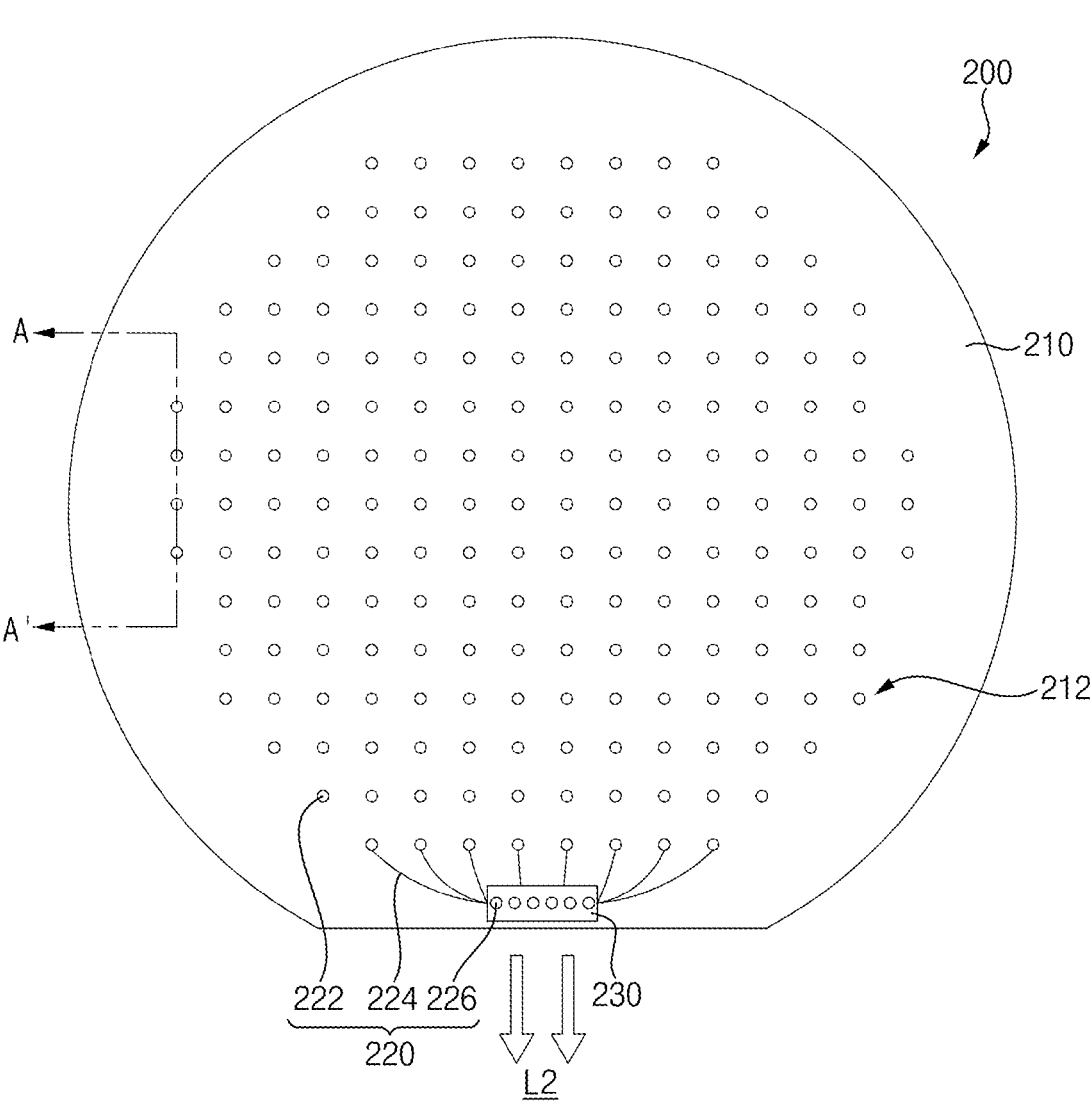
FIG. 2 is a plan view illustrating the light collecting device in FIG. 1.
Figure 3:
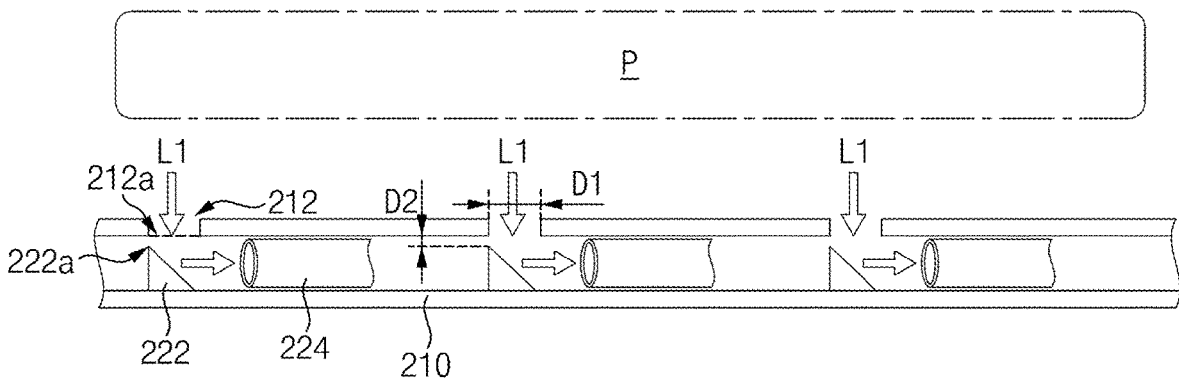
FIG. 3 is a cross-sectional view taken along line A-A' in FIG. 2.
Figure 4:
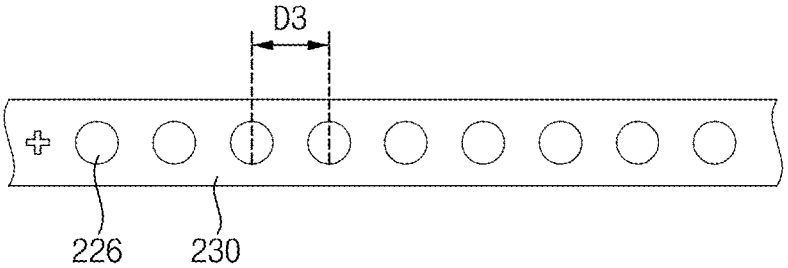
FIG. 4 is a front view illustrating an alignment fixture to which a plurality of collimators are fixed.
Figure 5:
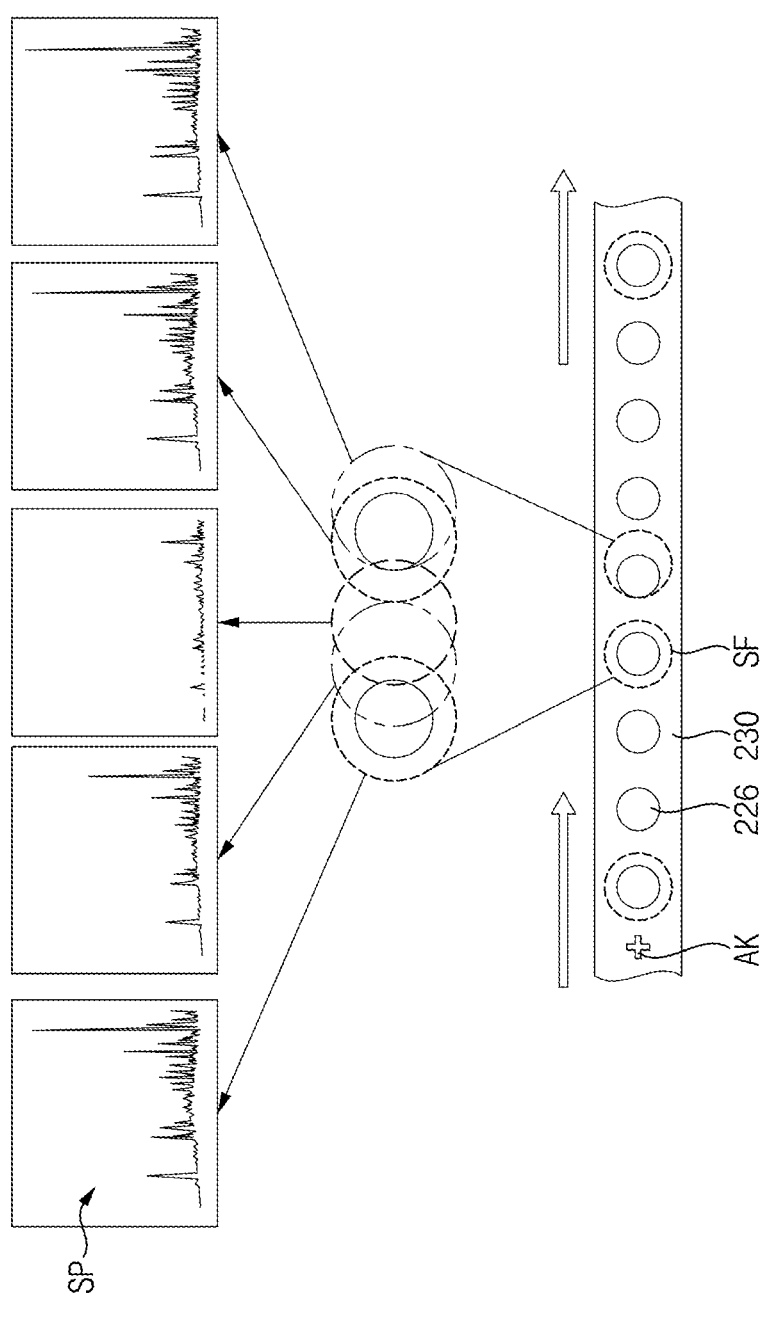
FIG. 5 is a view illustrating a process of scanning the collimators in FIG. 4 through an optical scanner.
Figure 6:
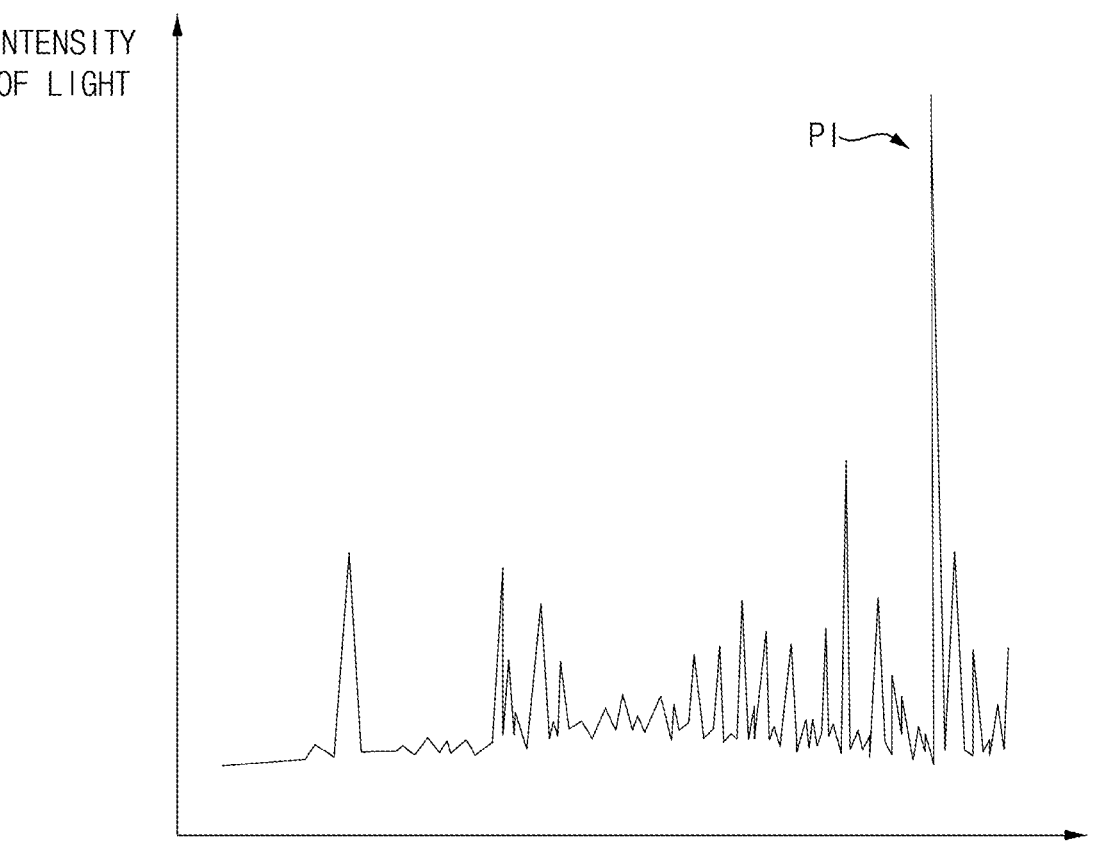
FIG. 6 is a graph illustrating an intensity of light over time that is obtained from one collimator.

FIG. 1 is a cross-sectional view illustrating a plasma monitoring system in accordance with example embodiments. FIG. 2 is a plan view illustrating the light collecting device in FIG. 1. FIG. 3 is a cross-sectional view taken along line A-A' in FIG. 2. FIG. 4 is a front view illustrating an alignment fixture to which a plurality of collimators are fixed. FIG. 5 is a view illustrating a process of scanning the collimators in FIG. 4 through an optical scanner. FIG. 6 is a graph illustrating an intensity of light over time that is obtained from one collimator.

Referring to FIGS. 1 to 6, a plasma monitoring system 10 may include a chamber 100 with an interior space for performing a plasma process on a semiconductor substrate, a light collecting device 200 provided to collect light L1 that is emitted from plasma P in the chamber 100 and to discharge the light L1 (as light L2) to outside of the chamber 100, and a light analysis device 300 provided to obtain optical spectrum from the light L2 that is emitted from the light collecting device 200 and to map a state of the plasma P. The plasma monitoring system 10 may further include a substrate stage 110 that has a seating surface capable of supporting the semiconductor substrate.

The plasma monitoring system 10 may include a plasma processing apparatus capable of forming plasma P on the semiconductor substrate in the chamber 100. The plasma monitoring system 10 may include the light collecting device 200 on the seating surface of the substrate stage 110 on which the semiconductor substrate is disposed, and the state of the plasma P generated by the plasma processing apparatus may be monitored through the light collecting device 200 and the light analysis device 300 (i.e., light analyzer). The plasma monitoring system 10 may include the light collecting device 200 on the substrate stage 110 (e.g., instead of the semiconductor substrate) to monitor the state of the plasma P. The plasma processing apparatus may include an upper electrode 20 and a source power circuit portion 30.

The plasma processing apparatus may be referred to as an apparatus capable of etching a target film on the semiconductor substrate, e.g., a semiconductor wafer. The semiconductor substrate may be disposed in the chamber 100 for a plasma etching process. The plasma processing apparatus is not necessarily limited to an etching apparatus, and may be used as, e.g., a deposition apparatus and a cleaning apparatus. For example, the semiconductor substrate may include a silicon substrate, a glass substrate or the like.

The plasma processing apparatus may include a capacitively coupled plasma (CCP) processing apparatus. However, the plasma generated by the plasma processing apparatus is not limited to capacitively coupled plasma, and the plasma may include, e.g., inductively coupled plasma (ICP) and microwave plasma.

The plasma etching process may be referred to as a process in which electromagnetic energy is applied to at least one precursor gas or precursor vapor to convert the precursor into reactive plasma. The plasma etching process may be used to etch materials, e.g., blanket dielectric films, on semiconductor devices, e.g., the semiconductor substrate. For example, the plasma monitoring system 10 may be used to obtain data to determine an etch end point within the plasma etch process.

The electromagnetic energy may be applied to the precursor gas or the precursor vapor to generate the plasma P from the precursor. During the process of generating the plasma P, the plasma P may emit light L1, e.g., of a predetermined wavelength. The light L1 may be emitted while the plasma P is ionized.

In example embodiments, the chamber 100 may provide an enclosed space for performing the plasma process on the semiconductor substrate. The chamber 100 may include a cylindrical vacuum chamber. The chamber 100 may include a metal, e.g., aluminum or stainless steel. For example, the chamber 100 may be referred to as a plasma processing chamber that has a tuning electrode inside the substrate stage 110 for enhanced processing rate and plasma profile uniformity.

The substrate stage 110 supporting the semiconductor substrate may be provided inside the chamber 100. For example, the substrate stage 110 may serve as a susceptor to support the semiconductor substrate. The substrate stage 110 may include an electrostatic chuck to hold the semiconductor substrate with an electrostatic adsorption force. The electrostatic chuck may adsorb and hold the semiconductor substrate with electrostatic power through a direct current voltage that is supplied from a direct current power source.

The semiconductor substrate may be disposed on an upper surface of the electrostatic chuck, and a focus ring may be mounted around the semiconductor substrate. A substrate electrode may be disposed under the semiconductor substrate. Also, the substrate electrode may have a circulation channel to provide cooling thereto. For precision of wafer temperature, a cooling gas, e.g., He gas, may be supplied between the electrostatic chuck and the semiconductor substrate.

The chamber 100 may include a side wall 102 having an optical window 120. The optical window 120 may be provided to transmit light from an inner space of the chamber 100 to the outside. That is, the optical window 120 may be referred to as a viewing mechanism for the interior of the chamber 100, and the optical window 120 may include materials, e.g., glass, quartz, fused silica, or sapphire, according to a chemical action of the plasma P.

A gate for entering and exiting the semiconductor substrate may be installed on the side wall 102 of the chamber 100. The semiconductor substrate may be loaded onto and unloaded from the substrate stage through the gate.

An exhaust port 40 may be installed in a lower portion of the chamber 100, and an exhaust portion 42 may be connected to the exhaust port 40 through an exhaust pipe. The exhaust portion 42 may include a vacuum pump, e.g., a turbo molecular pump, to adjust a processing space inside the chamber 100 to a desired vacuum level. Also, process by-products and residual process gases that are generated in the chamber 100 may be discharged through the exhaust port 40.

The chamber 100 may include a cover 104 covering an upper portion of the chamber 100. The cover 104 may seal the upper portion of the chamber 100.

The upper electrode 20 may be disposed on an outer upper portion of the chamber 100 to face the substrate electrode. The upper electrode 20 may be disposed on the cover 104, e.g., the cover 104 may be between the upper electrode 20 and the substrate stage 110. A chamber space between the upper electrode 20 and the substrate electrode on the substrate stage 110 may be used as a plasma generating region. The upper electrode 20 may have a surface facing the semiconductor substrate on the substrate stage 110.

The upper electrode 20 may be supported by an insulating shield member above the chamber 100. The upper electrode 20 may include a circular electrode plate. The upper electrode 20 may have a plurality of supply holes through which gas is supplied into the chamber 100.

The source power circuit portion 30 may supply plasma source power to the upper electrode 20. The source power circuit portion 30 may be connected to the upper electrode 20 through the first signal line 36. For example, the source power circuit portion 30 may include a high frequency generator 32 and a matcher 34 as plasma source elements. The high frequency generator 32 may generate a high frequency (RF) signal. The matcher 34 may match an output impedance of an RF signal that is generated from the high frequency generator 32 to control the plasma P that is generated using the upper electrode 20. The matcher 34 may change an internal capacitor to control the output impedance.

In example embodiments, the substrate stage 110 may include a substrate support 112 that has the seating surface to support the semiconductor substrate, and a substrate electrode 114 provided on the substrate support 112. The light collecting device 200 may be disposed on the seating surface of the substrate stage 110. For example, the substrate stage 110 may provide a conductor, e.g., a radio frequency (RF) electrode, a clamping electrode, or a resistance heating element on an inside or a surface, and the substrate stage 110 may serve as a heater or the electrostatic chuck.

The substrate support 112 may include metallic or ceramic materials. For example, the metallic or the ceramic materials may include at least one of a metal (e.g., a non-compound metal), a metal oxide, a metal nitride, a metal oxynitride, or any combination thereof. For example, the substrate support 112 may include aluminum, aluminum oxide, aluminum nitride, aluminum oxynitride, or any combination thereof.

The substrate electrode 114 may be disposed under the semiconductor substrate. The substrate electrode 114 may have a circulation channel to cool therein. Also, for precision of the wafer temperature, a cooling gas, e.g., He gas, may be supplied between the electrostatic chuck and the semiconductor substrate. The substrate electrode 114 may cool the semiconductor substrate in contact with high-temperature plasma.

The power circuit portion 60 may supply bias power to the substrate electrode 114. The power circuit portion 60 may include a bias RF power supply and the bias RF matcher as bias elements. The substrate electrode 114 may attract plasma atoms or ions that are generated in the chamber 100 through the power circuit portion 60.

A capacitor variable portion 62 may vary a capacitor of the substrate electrode 114. For example, the capacitor variable portion 62 may be connected to the substrate electrode 114 through the second signal line 64. The capacitor variable portion 62 may include an electronic tuner and an electronic sensor that are variable capacitors. The electronic sensor may be referred to as a voltage or current sensor, and the electronic sensor may be connected to the electronic tuner to control the plasma in the chamber 100.

In example embodiments, the plasma processing apparatus may further include a gas supply portion that is configured to supply gas into the chamber 100. For example, the gas supply portion may include gas supply pipes 50, a flow controller 52, and a gas supply source 54 as gas supply elements. The gas supply pipes 50 may supply various gases to an upper portions and/or side of the chamber 100. The gas supplied by the gas supply pipes 50 may be injected into the chamber 100 through the shower head 56 in the cover 104. The shower head 56 may directly spray various gases into the plasma space P in the chamber 100.

The gas supply portion may supply different gases at a desired ratio. The gas supply source 54 may store a plurality of gases, and the gases may be supplied through a plurality of gas lines that are respectively connected to the gas supply pipes 50. The flow controller 52 may control a supply flow rate of gases introduced into the chamber 100 through the gas supply pipes 50. The flow controller 52 may independently or commonly control the supply flow rates of the gases respectively supplied to a vertical gas supply pipe and a horizontal gas supply pipe. For example, the gas supply source 54 may include a plurality of gas tanks, and the flow controller 52 may include a plurality of mass flow controllers (MFCs) respectively corresponding to the gas tanks. The mass flow controllers may independently control the supply flow rates of the gases.

In example embodiments, the light collecting device 200 may be disposed on the seating surface of the substrate stage 110, e.g., on a surface of the substrate stage 110 facing the cover 104. The light collecting device 200 may include a body 210 having a plurality of through holes 212, and a plurality of light collectors 220 configured to radiate the light L1 that is irradiated into the through holes 212 onto the optical window 120. The light collecting device 200 may further include an alignment fixture 230 provided on one side of the body 210 and fixing a portion of each of the light collectors 220.

The light collecting device 200 may transmit the light L1 that is emitted from the plasma P to the light analysis device 300. The light collecting device 200 may be disposed on the substrate stage 110 like the semiconductor substrate, and may receive the light L1 from the plasma P in real time. The light collecting device 200 may transmit the light L1 to the light analysis device 300 through the optical window 120 provided on the side wall 102 of the chamber 100.

As illustrated in FIG. 2, the body 210 may have a shape that is similar to a shape of the semiconductor substrate to be placed on the substrate stage 110. For example, the body 210 may include a circular shape. For example, the body 210 may include a semiconductor wafer type body, e.g., the body 210 may have an approximate circular or oval shape in a top view. The body 210 may include a material, e.g., glass, quartz, fused silica, or sapphire, according to the chemical action of the plasma.

As illustrated in FIG. 2, the body 210 may have a plurality of through holes 212 collecting the light L1 that is emitted from the plasma P. For example, as illustrated in FIG. 3, the body 210 may include two thin plates parallel to each other and spaced apart from each other, e.g., the two thin plates may be parallel to the substrate stage 110. For example, as further illustrated in FIG. 3, the plurality of through holes 212 may extend through an entire thickness of one of the two parallel plates of the body 210, e.g., the plurality of through holes 212 may be spaced apart from each other and extend through the entire thickness of the plate of the body 210 facing the cover 104 to be in fluid communication both with the plasma region and the space between the two plates. For example, as illustrated in FIG. 3, each of the through holes 212 may have an opening that is opened toward the plasma region (e.g., and facing the cover 104). The through hole 212 may transfer the light L1 from the plasma region into the light collecting device 200 through the opening (i.e., see vertical arrows pointing down in FIG. 3).

The plurality of through holes 212 may be arranged and distributed over a wide area to measure the state of the plasma P onto the body 210. The plurality of through holes 212 may be arranged to be spaced apart from each other onto the body 210, e.g., the plurality of through holes 212 may be spaced apart at equal intervals in a majority of an area of the body 210 facing the cover 104 (e.g., a distance between two outermost through holes 212 may be equal 1.5 times of a radius of the body 210).

In example embodiment, as further illustrated in FIG. 3, each of the light collectors 220 may include a reflection mirror 222 that reflects the light L1 incident through the through hole 212, an optical fiber 224 that transmits the light L1 reflected from the reflection mirror 222, and a collimator 226 that illuminates (e.g., irradiates) the light L1 transmitted (e.g., transferred) from the optical fiber 224 toward the optical window 120. For example, the light collectors 220 may use local emission light collector (LELC) technology.

As illustrated in FIG. 3, a plurality of reflection mirrors 222 may be provided under the through holes 212 of the body 210, respectively, e.g., in a one-to-one correspondence. For example, as illustrated in FIG. 3, the reflection mirrors 222 may be provided in the space between the two parallel plates of the body 210. The reflection mirror 222 may reflect the light L1 that is emitted from the plasma P in the plasma region and is incident through the through hole 212 onto the reflection mirror 222. The through hole 212 may have a first diameter D1. The through hole 212 may limit an area of the light L1 incident on the through hole 212 through the first diameter D1. The through hole 212 may obtain the light L1 within a limited area at a specific location of the through hole 212 through the first diameter D1. For example, the first diameter D1 may be within a range of 10 μm to 1 mm.

The reflection mirror 222 may reflect the light L1 that is vertically incident into the through hole 212 in the horizontal direction (see horizontal arrows in FIG. 3). The reflection mirror 222 may reflect the incident light L1 to one end of the optical fiber 224. An upper end 222a of the reflection mirror 222 may be spaced apart from a lower end 212a of the through hole 212 by a second distance D2. The reflection mirror 222 may limit the area of the light L1 incident through the second distance D2. The reflection mirror 222 may limit the area of the light L1 incident through the second distance D2 to obtain the light L1 within the limited area at a location of the specific through hole 212. The second distance D2 may be within a range of 50 μm to 2 mm.

For example, the reflection mirror 222 may include calcium fluoride ($CaF_2$), fused silica (FS), germanium (Ge), magnesium fluoride ($MgF_2$), N-BK7, potassium bromide (KBr), sapphire, silicon (Si), sodium chloride (NaCl), selenium zincide (ZnSe), and zinc sulfide (ZnS).

The one end (i.e., a first end) of each of the optical fibers 224 may be provided on the reflection mirror 222, e.g., the one end of each of the optical fibers 224 may be adjacent to and face the reflection mirror 222. The one end of each of the optical fibers 224 may be provided to face the reflection mirror 222. Another end (i.e., a second end) opposite to the one end (i.e., the first end) of the optical fiber 224 may be connected to the collimator 226. The optical fiber 224 may extend from the reflection mirror 222 toward the collimator 226 inside the body 210. The optical fiber 224 may transfer the reflected light to the collimator 226 from the reflection mirror 222, e.g., the optical fibers 224 and the collimators 226 may have a one-to-one correspondence.

The one ends of the optical fibers 224 may be distributed in the body 210 toward the through holes 212, e.g., the through holes 212 and the optical fibers 224 may have a one-to-one correspondence. The other ends of the optical fibers 224 may be assembled at one side of the body 210. The other ends of the optical fibers 224 may be respectively connected to collimators 226 that are arranged on the one side of the body 210, e.g., all the collimators 226 may be positioned along a single edge of the body 210.

The optical fiber 224 may include a multimode fiber or a planar waveguide. The optical fiber 224 may transmit the reflected light having guided modes through the multimode fiber. The optical fiber 224 may transmit the reflected light having a plurality of wavelengths through the multimode fiber, and the multimode fiber may have a high incident efficiency through a large core. The optical fiber 224 may transmit the reflected light in a two-dimensional direction through the planar waveguide.

The collimator 226 may be connected to the other end of the optical fiber 224. The collimator 226 may receive the reflected light from the optical fiber 224. One (i.e., a single) collimator 226 may receive reflected light from one (i.e., a single) optical fiber 224. The collimator 226 may generate a parallel light beam L2 from the light transmitted from the optical fiber 224. The collimator 226 may illuminate (e.g., irradiate) the parallel light beam L2 toward the optical window 120. The collimators 226 may simultaneously illuminate the parallel light beams L2 toward the optical window 120 from the one side of the body 210.

As illustrated in FIG. 4, the collimators 226 may be aligned on the one side of the body 210. The collimators 226 may be arranged on the one side of the body 210 in a predetermined arrangement. The collimators 226 may be arranged in the predetermined arrangement such that the light analysis device 300 may acquire and classify the lights L2 illuminated from the collimators 226, respectively. The collimators 226 may be arranged to be spaced apart from each other by a third distance D3, e.g., adjacent ones of the collimators 226 may be spaced apart from each other by the third distance D3. For example, the third distance D3 may be within a range of 0.1 mm to 10 mm.

In example embodiments, as illustrated in FIG. 2, the light collecting device 200 may further include the alignment fixture 230 provided on the one side of the body 210. The alignment fixture 230 may fix the collimators 226 of the light collectors 220 in the predetermined arrangement. The alignment fixture 230 may fix the collimators 226 such that the collimators 226 illuminate (e.g., irradiate) the lights L2 toward the optical window 120.

The alignment fixture 230 may have a number for indicating the through hole 212 connected to the collimator 226 at a position where the collimator 226 is fixed. The collimator 226 may be provided at a correct position through the number.

In example embodiments, the light analysis device 300 may receive the light L2 from the light collecting device 200 through the optical window 120 that is provided on the side wall 102 of the chamber 100. The light analysis device 300 may map the state of the plasma P in the chamber 100 to correspond to the positions of the through holes 212. As illustrated in FIG. 1, the light analysis device 300 may include an optical scanner 310 that sequentially scans the lights L2 reflected from the light collectors 220, and a spectrometer 320 that obtains an optical spectrum from the light L2.

The optical scanner 310 may be provided adjacent to the optical window 120. The optical scanner 310 may capture the light L2 illuminated from each of the collimators 226 through the optical window 120. The optical scanner 310 may have a photographing area capable of capturing the collimators 226 of the light collecting device 200 through the optical window 120. The photographing area may cover all of the collimators 226 that are arranged in the predetermined arrangement.

As illustrated in FIG. 5, the optical scanner 310 may move a photographing focal point SF to capture each of the collimators 226 within the photographing area. The optical scanner 310 may enlarge and capture each of the collimators 226. The optical scanner 310 may move the photographing focal point SF in a vertical direction or a left-right direction to capture each of the collimators 226. For example, after the optical scanner 310 fixes the photographing focal point SF to an align key AK, the optical scanner 310 may sequentially capture each of the collimators 226.

The spectrometer 320 may obtain the optical spectrum SP from the light L2 that is captured by the optical scanner 310 from the collimator 226. The spectrometer 320 may obtain the optical spectrums SP from the lights L2 of the collimators 226 that are captured by the optical scanner 310, respectively. The optical spectrum SP may have intensity of light according to time. For example, the spectrometer 320 may include a time domain spectroscopy (TDS).

The light analysis device 300 may map the state of the plasma P to correspond to the positions of the through holes 212. The light analysis device 300 may classify the optical spectrums SP that are obtained from the collimators 226, respectively. The light analysis device 300 may classify the optical spectrums SP according to through holes 212. The light analysis device 300 may determine the through hole 212 corresponding to the optical spectrum SP through each of the collimators 226. The light analysis device 300 may determine which collimator 226 corresponds to which through hole 212 through the predetermined arrangement of the collimators 226.

The light analysis device 300 may analyze the state of the plasma P from the optical spectrum. The light analysis device 300 may store the state of the plasma P corresponding to the positions of the through holes 212. The light analysis device 300 may store the mapped state of the plasma P according to the time to form a database. The light analysis device 300 may compare the state of the plasma obtained in real time with the database.

A process kit for providing an optimal plasma environment may be improved through the stored database. For example, the process kit may include all conditions of the plasma monitoring system 10 for providing the optimal plasma environment, e.g., the location of the through hole 212 of the light collecting device 200 and capturing speed of the optical scanner 310.

As illustrated in FIG. 6, the light analysis device 300 may extract a peak intensity PI having a highest intensity from the optical spectrum to map the state of the plasma P. The light analysis device 300 may shorten a time for determining the state of the plasma by extracting the peak intensity. The light analysis device 300 may extract the peak intensity to distinguish the light L2 emitted from the collimator 226 from noise.

As described above, the light collecting device 200 may be provided on the substrate stage 110 on which the semiconductor substrate is disposed. The light collecting device 200 may obtain the light L1 from the through holes 212 through the plurality of light collectors 220. The through holes 212 may be arranged on the body 210. The light analysis device 300 may obtain the optical spectrum from the lights through the spectrometer 320, and the state of the plasma may be mapped to correspond to the positions of the through holes 212 on the body 210.

Also, the plasma monitoring system 10 two-dimensionally analyzes the state of the plasma P on the substrate stage 110, and an administrator may intuitively recognize a situation in the chamber 100 through the state of the mapped plasma. Therefore, the administrator may improve the process kit through the plasma monitoring system 10, a height of the substrate stage 110 on which the semiconductor substrate is disposed may be optimized, and a temperature on the substrate stage 110 may be controlled locally.

Figure 7:
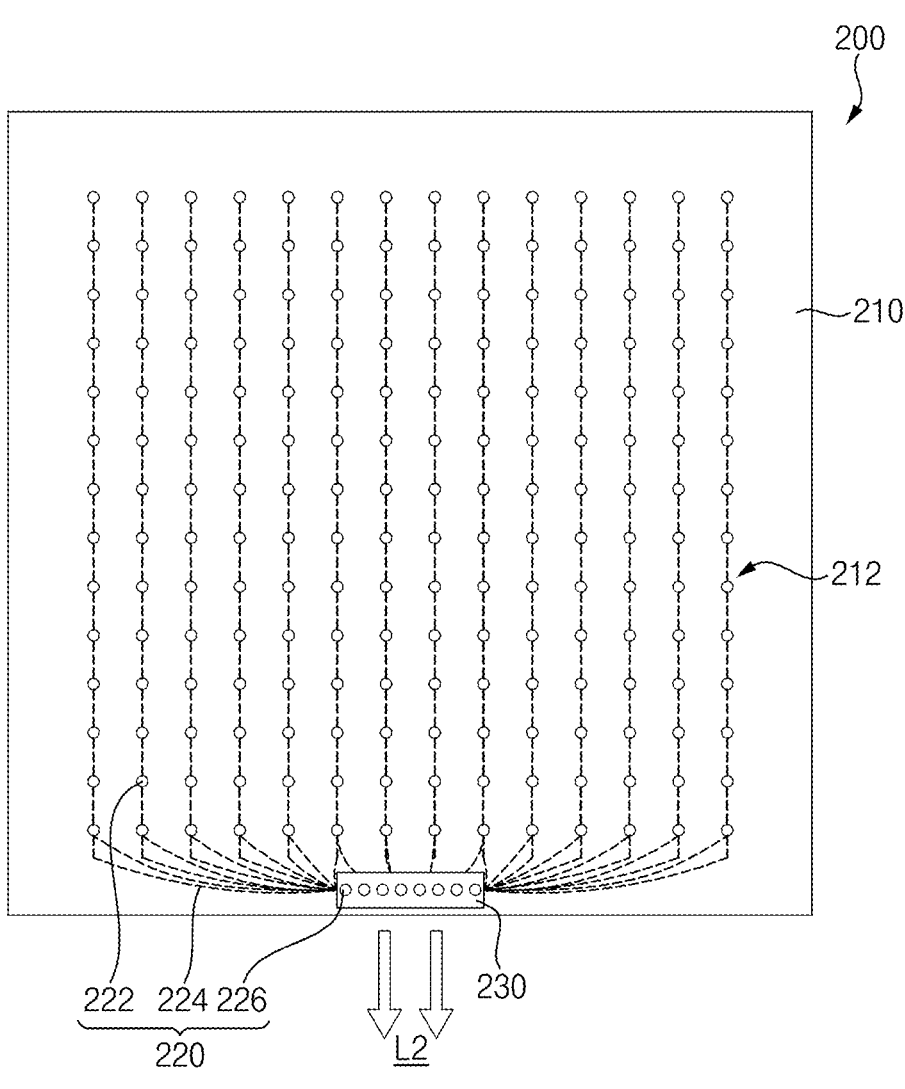
FIG. 7 is a plan view illustrating a light collecting device of a plasma monitoring system having a deformed body in accordance with example embodiments.

FIG. 7 is a plan view illustrating a light collecting device of a plasma monitoring system having a modified body in accordance with example embodiments. The plasma monitoring system may be substantially the same as or similar to the plasma monitoring system described with reference to FIGS. 1 to 6, except for a configuration of a light collecting device. Thus, same or similar components are denoted by the same or similar reference numerals, and repeated descriptions of the same components will be omitted.

Referring to FIGS. 1 to 7, a light collecting device 200a of the plasma monitoring system may be disposed on the seating surface of the substrate stage 110. The light collecting device 200a may include a body 210a having a plurality of the through holes 212, and a plurality of the light collectors 220 that radiate (e.g., transmit) the light L1 irradiated onto the through holes 212 to the optical window 120, respectively. The light collecting device 200a may further include the alignment fixture 230 provided on one side of the body 210a and fixing the one end of each of the light collectors 220.

As illustrated in FIG. 7, the body 210a may have a shape that is similar to a photomask to be disposed on the substrate stage 110, e.g., the body 210a may have a quadrangular shape in a top view. The body 210a may have a rectangular shape. For example, the body 210a may include a photomask type body. The body 210a may include a material, e.g., glass, quartz, fused silica, or sapphire, according to the chemical action of the plasma.

The plurality of through holes 212 may be arranged and distributed over a wide area to measure the state of the plasma P onto the body 210a. The plurality of through holes 212 may be arranged to be spaced apart from each other on the body 210a. The plurality of through holes 212 may be arranged to be spaced apart from each other by a first distance between the through holes provided adjacent to each other. For example, the first distance between the through holes 212 may be within a range of 1 mm to 100 mm.

By way of summation and review, in an optical emission spectroscopy for monitoring a plasma process, the plasma state may be monitored within a limited range through a one-dimensional emission spectrum inside a chamber. When the plasma state is monitored through the one-dimensional emission spectrum that is obtained within the limited range, the reliability is lowered and it may be difficult to perform precise analysis.

In contrast, Example embodiments provide a plasma monitoring system having a light collecting device and a light analysis device that are capable of improving reliability of plasma state determination and performing precise analysis. That is, according to example embodiments, a plasma monitoring system may include a chamber providing a plasma space configured to perform a semiconductor process on a semiconductor substrate using plasma. The chamber includes a side wall that has an optical window therein, a substrate stage within the chamber and configured to support the semiconductor substrate, a light collecting device on the substrate stage that includes a plurality of light collectors configured to collect lights, respectively, from the plasma and transfer the collected lights onto the optical window, and a light analysis device including a spectrometer that is configured to obtain optical spectrum from each of the lights irradiated onto the optical window, and to map a state of the plasma from the optical spectrum to correspond to positions of through holes accommodating the light collectors.

Thus, the light collecting device may be provided on the substrate stage on which the semiconductor substrate is disposed. The light collecting device may obtain the lights from the through holes through the plurality of light collectors. The through holes may be arranged on the body. The light collectors may use local emission light collector (LELC) technology. The light analysis device may obtain the optical spectrum from the lights through the spectrometer, and the state of the plasma may be mapped to correspond to the positions of the through holes.

Also, the plasma monitoring system two-dimensionally analyzes the state of the plasma on the substrate stage, and an administrator may intuitively recognize a situation in the chamber through the state of the mapped plasma. Therefore, the administrator may improve a process kit through the plasma monitoring system, height of the substrate stage on which the semiconductor substrate is disposed may be optimized, and a temperature on the substrate stage may be controlled locally Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A plasma monitoring system, comprising:
   a chamber with an interior space, the chamber being configured to perform a semiconductor process on a semiconductor substrate using plasma in the interior space, and the chamber including a side wall with an optical window;
   a substrate stage within the chamber, the substrate stage being configured to support the semiconductor substrate;
   a light collecting device on the substrate stage, the light collecting device including a body and light collectors, the body having through holes therethrough, each light collector being configured to collect light from the plasma that is incident on a corresponding one of the through holes and to transfer the light onto the optical window; and
   a light analyzer including a spectrometer that is configured to obtain an optical spectrum from the light transferred onto the optical window, and to map a state of the plasma from the optical spectrum to correspond to positions of the through holes,
   wherein each of the light collectors includes:
      a reflection mirror configured to reflect at least a portion of the light incident through the corresponding one of the through holes;
      an optical fiber configured to transmit at least the portion of the light reflected from the reflection mirror; and
      a collimator configured to transmit at least the portion of the light transmitted from the optical fiber toward the optical window.
2. The plasma monitoring system as claimed in claim 1, wherein each optical fiber is a multimode fiber or a planar waveguide.
3. The plasma monitoring system as claimed in claim 1, wherein a lower portion of each of the through holes is spaced apart from an upper portion of the reflection mirror by 50 μm to 2 mm.

4. The plasma monitoring system as claimed in claim 1, wherein the light collecting device further includes an alignment fixture on one side of the body, the alignment fixture being configured to fix the collimator of each of the light collectors in a predetermined arrangement.
5. The plasma monitoring system as claimed in claim 4, wherein the collimator of each of the light collectors is spaced apart from an adjacent collimator by the alignment fixture within a distance in the range of 0.1 mm to 10 mm.
6. The plasma monitoring system as claimed in claim 1, wherein a diameter of each of the through holes is within a range of 10 μm to 1 mm.
7. The plasma monitoring system as claimed in claim 1, wherein, with respect to a top-down view, the body of the light collecting device has a circular or a quadrangular shape.
8. The plasma monitoring system as claimed in claim 1, wherein the light analyzer further includes an optical scanner that is configured to sequentially scan the light reflected from the light collectors.
9. The plasma monitoring system as claimed in claim 1, wherein the light analyzer is configured to extract a peak intensity from the optical spectrum to map the state of the plasma.
10. A plasma monitoring system, comprising:
   a chamber with an interior space, the chamber being configured to perform a semiconductor process on a semiconductor substrate using plasma in the interior space, and the chamber including an optical window and a substrate stage;
   a light collecting device on the substrate stage, the light collecting device including a body and light collectors, the body having through holes therethrough, each light collector being configured to collect light from the plasma that is incident on a corresponding one of the through holes and to transfer the light onto the optical window; and
   a light analyzer configured to obtain an optical spectrum from each light irradiated onto the optical window, and to map a state of the plasma from the optical spectrum to correspond to positions of the through holes,
   wherein each of the light collectors includes:
      a reflection mirror configured to reflect at least a portion of the light incident on the corresponding one of the through holes,
      an optical fiber configured to transmit at least the portion of the light reflected from the reflection mirror, and
      a collimator configured to illuminate at least the portion of the light transmitted from the optical fiber toward the optical window.
11. The plasma monitoring system as claimed in claim 10, wherein the optical fiber includes a multimode fiber or a planar waveguide.
12. The plasma monitoring system as claimed in claim 10, wherein a lower portion of each of the through holes is spaced apart from an upper portion of the reflection mirror by a distance of 50 μm to 2 mm.
13. The plasma monitoring system as claimed in claim 10, wherein the light collecting device further includes an alignment fixture at one side of the body, the alignment fixture fixing the collimator of each of the light collectors in a predetermined arrangement.
14. The plasma monitoring system as claimed in claim 13, wherein the collimator of each of the light collectors is spaced apart from an adjacent collimator by a distance of 0.1 mm to 10 mm along the alignment fixture.

15. The plasma monitoring system as claimed in claim 10, wherein a diameter of each of the through holes is within a range of 10 μm to 1 mm.

16. The plasma monitoring system as claimed in claim 10, wherein, with respect to a top-down view, the body of the light collecting device has a circular or a quadrangular shape.

17. The plasma monitoring system as claimed in claim 10, wherein the light analyzer further includes an optical scanner that is configured to sequentially scan the light reflected from the light collectors.

18. The plasma monitoring system as claimed in claim 10, wherein the light analyzer is configured to extract a peak intensity from the optical spectrum to map the state of the plasma.

19. A plasma monitoring system, comprising:

a chamber with an interior space, the chamber being configured to perform a semiconductor process on a semiconductor substrate using plasma in the interior space, and the chamber including an optical window and a substrate stage configured to support the semiconductor substrate;

a light collecting device on the substrate stage, the light collecting device including a body with through holes, each light collector being configured to collect light incident on a corresponding one of the through holes and to transfer the light onto the optical window, and an alignment fixture at one side of the body that fixes the light collectors in a predetermined arrangement; and a light analyzer including an optical scanner and a spectrometer, the light analyzer being configured to map a state of the plasma from an optical spectrum to correspond to positions of the through holes, the optical scanner being configured to sequentially scan the light reflected from the light collectors, and the spectrometer being configured to obtain the optical spectrum from the light, wherein each of the light collector includes:

a reflection mirror configured to reflect at least a portion of the light incident on the corresponding one of the through holes, an optical fiber configured to transmit at least the portion of the light reflected from the reflection mirror, and a collimator configured to illuminate at least the portion of the light transmitted from the optical fiber toward the optical window.

* * * * *